(12) United States Patent
Lesso

(10) Patent No.: US 11,600,280 B2
(45) Date of Patent: Mar. 7, 2023

(54) ANALOG-TO-DIGITAL CONVERTER AND METHOD

(71) Applicant: Cirrus Logic International Semiconductor Ltd., Edinburgh (GB)

(72) Inventor: John P. Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 177 days.

(21) Appl. No.: 17/036,382

(22) Filed: Sep. 29, 2020

(65) Prior Publication Data
US 2022/0101863 A1 Mar. 31, 2022

(51) Int. Cl.
| | |
|---|---|
| H03M 1/12 | (2006.01) |
| H03M 1/08 | (2006.01) |
| G10L 19/02 | (2013.01) |
| G10L 19/26 | (2013.01) |
| G10L 21/0232 | (2013.01) |

(52) U.S. Cl.
CPC .............. *G10L 19/02* (2013.01); *G10L 19/26* (2013.01); *G10L 21/0232* (2013.01); *H03M 1/124* (2013.01)

(58) Field of Classification Search
CPC ..... G10L 19/02; G10L 19/26; G10L 21/0232; H03M 1/124
See application file for complete search history.

(56) References Cited

U.S. PATENT DOCUMENTS

| | | | | |
|---|---|---|---|---|
| 5,091,956 | A * | 2/1992 | Miki | H04B 1/66 333/17.1 |
| 6,501,329 | B1 * | 12/2002 | Petrofsky | H03H 17/0294 327/552 |
| 8,836,552 | B1 * | 9/2014 | Tietjen | H03M 1/1038 341/118 |
| 10,848,170 | B1 * | 11/2020 | Thiagarajan | H03G 3/30 |
| 2014/0273901 | A1 * | 9/2014 | Liu | H04W 52/0238 455/226.1 |
| 2016/0126968 | A1 * | 5/2016 | Lesso | H03M 7/30 341/155 |
| 2017/0077938 | A1 * | 3/2017 | Heu | H03M 3/422 |
| 2021/0288656 | A1 * | 9/2021 | Ganesan | H03M 1/0604 |
| 2022/0223133 | A1 * | 7/2022 | McCutcheon | G10K 11/17881 |

OTHER PUBLICATIONS

W. A. Smith, B. J. Mogen, E. E. Fetz, V. S. Sathe and B. P. Otis, "Exploiting Electrocorticographic Spectral Characteristics for Optimized Signal Chain Design: [ . . . ]," in IEEE Transactions on Biomedical Circuits and Systems, vol. 10, No. 6, pp. 1171-1180, Dec. 2016, doi: 10.1109/TBCAS.2016.2518923. (Year: 2016).*
International Search Report and Written Opinion of the International Searching Authority, International Application No. PCT/GB2021/052132, dated Nov. 10, 2021.

(Continued)

*Primary Examiner* — Jialong He
(74) *Attorney, Agent, or Firm* — Jackson Walker L.L.P.

(57) ABSTRACT

An analogue-to-digital converter (ADC), comprising: an adaptive whitening filter configured to filter an analogue input signal and output a whitened analogue input signal; a first converter configured to receive said whitened analogue input signal and output a whitened digital signal; a controller configured to adapt the whitening filter based on the received analogue input signal.

22 Claims, 6 Drawing Sheets

(56) References Cited

OTHER PUBLICATIONS

Smith, William A. et al.: "Exploiting Electrocorticographic Spectral Characteristics for Optimized Signal Chain Design: A 1.08 Analog Front End With Reduced ADC Resolution Requirements", IEEE Transactions on Biomedical Circuits and Systems, IEEE, US, vol. 10, No. 6, Dec. 1, 2016 (Dec. 1, 2016), pp. 1171-1180.

Venkatraman S et al.: "Exploiting the 1/f structure of neural signals for the design of integrated neural amplifiers", Proceedings of The 31st Annual International Conference of the IEEE Engineering in Medicine and Biology Society: Engineering the Future of Biomedicine, EMBC 2889, I EEE, Sep. 3, 2009 (Sep. 3, 2009), pp. 2050-2053.

\* cited by examiner

ANALOG-TO-DIGITAL CONVERTER AND METHOD

TECHNICAL FIELD

The present disclosure relates to analogue-to-digital converters (ADCs) and in particular ADCs for converting audio signals containing speech.

BACKGROUND

Analogue-to-digital converters (ADCs) are known and used in a variety of applications. One particular application is within audio signal paths where it is desired to store and transmit audio in digital format. An ADC may therefore be arranged in an audio signal path to convert an analogue signal such as that detected by a microphone, into an equivalent digital signal, i.e. digital data, which may be stored or passed on for further processing.

In communications devices, such as mobile telephones, integrated microphones are required to have a relatively large dynamic range to cope with large-amplitude interfering signals such as wind noise. Consequently, there is a need for ADCs used in such devices to also have a large dynamic range to convert analogue signals over their full dynamic range.

SUMMARY

According to a first aspect of the disclosure, there is provided an analogue-to-digital converter (ADC), comprising: an adaptive whitening filter configured to filter an analogue input signal and output a whitened analogue input signal; a first converter configured to receive said whitened analogue input signal and output a whitened digital signal; a controller configured to adapt the whitening filter based on the received analogue input signal.

The ADC may further comprise an adaptive de-whitening filter configured to filter the whitened digital output signal and output a de-whitened digital output signal, the de-whitening filter being substantially inverse to the whitening filter. The controller may be configured to adapt the whitening filter based on the received analogue input signal.

The whitening filter may comprise one or more of a shelving filter, a bandpass filter, a high pass filter, and a differentiator.

The controller may be configured to adapt the whitening filter based on the whitened digital signal or the de-whitened digital output signal.

The controller may be further configured to adapt the first converter based on the received analogue input signal.

Additionally or alternatively, the controller may be configured to adapt the first converter based on the whitened digital signal or the de-whitened digital output signal. In some embodiments, the first converter is a sigma-delta ADC. In some embodiments, adapting of the first converter comprises one or more of: a) changing an order of the ADC; b) changing an over sample ratio of the ADC; c) changing a bias current of one or more circuits in the ADC; d) changing a number of bits in a quantizer of the ADC; and e) switching between a high-performance integrator and a low-performance integrator.

In some embodiments, adapting the whitening filter comprises selectively bypassing the whitening filter. For example, the whitening filter may be bypassed if it was envisaged that the resultant signal output from the ADC were the input signal to be whitened would be clipped or out of range.

The ADC may further comprise a second converter configured to receive said analogue input signal and output a secondary digital signal to the controller. In which case, the controller may be configured to selectively bypass the whitening filter based on the secondary digital signal. The second converter may be a faster converter than the first converter. For example, the second converter may have a lower resolution or be of a different type than the first converter. For example, if the first converter is a sigma-delta ADC, the second converter may be a successive approximation ADC.

The controller may be configured to selectively bypass the whitening filter in response to detecting that the input audio signal exceeds a clipping threshold.

According to a further aspect of the disclosure, there is provided an integrated circuit comprising an ADC as described above.

According to a further aspect of the disclosure, there is provided an electronic device comprising an ADC as described above. The electronic device may comprise one or more of: a portable device; a battery powered device; a communications device; a mobile or cellular telephone; a personal media device; a computing device; a laptop, notebook or tablet computer; a gaming device; and a wearable device.

According to a further aspect of the disclosure, there is provided a method of analogue-to-digital conversion, comprising: whitening an analogue input signal with a whitening filter to generate a whitened analogue input signal; converting the whitened analogue input signal with a first converter to generate a whitened digital signal; and adapting the whitening filter based on the received analogue input signal.

The method may further comprise de-whitening the whitened digital signal with a de-whitening filter to generate a de-whitened digital signal, the de-whitening filter being substantially inverse to the whitening filter. In which case, the method may further comprise, adapting the de-whitening filter based on the received analogue input signal.

The whitening filter may comprise one or more of a shelving filter, a bandpass filter, a high pass filter, and a differentiator.

The de-whitened filter may be adapted based on the whitened digital signal or the de-whitened digital output signal.

The method may further comprise adapting the first converter based on the received analogue input signal.

The first converter may be adapted based on the whitened digital signal or the de-whitened digital output signal.

In some embodiments, the first converter is a sigma-delta ADC. Adapting of the first converter may comprise one or more of a) changing an order of the ADC; b) changing an over sample ratio of the ADC; c) changing a bias current of one or more circuits in the ADC; and d) changing a number of bits in a quantizer of the ADC.

Adapting the whitening filter may comprise selectively bypassing the whitening filter.

The method may further comprise converting with a second converter the analogue input signal to generate a secondary digital signal. The whitening filter may be selectively bypassed based on the secondary digital signal. The whitening filter may be otherwise adapted based on the secondary digital signal. The second converter may be a faster converter than the first converter. For example, the second converter may have a lower resolution or be of a different type than the first converter. For example, if the first converter is a sigma-delta ADC, the second converter may be a successive approximation ADC.

The whitening filter may be selectively bypassed in response to detecting that the input audio signal exceeds a clipping threshold.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

To maximise the effective resolution of an ADC, it is known to apply a signal-dependent analogue gain (GIN) to the input analogue signal prior to digital conversion and to apply a corresponding inverse digital gain (GO=1/GIN) adjustment to the converted digital signal in order to compensate for the applied analogue gain change GIN. This is known as dynamic range extension (DRE). Typically, a small amplitude analogue input signal may be amplified by a large value of GIN so as to make use of more of the ADC input range, thus effectively improving the resolution of the ADC for small amplitude signals. A correspondingly large digital attenuation is applied to the digital signal to compensate for the large analogue amplification. This means that, for small signals, the quantisation noise and thermal noise of the ADC may be attenuated by the low digital gain (GO=1/GIN).

Figure 1:
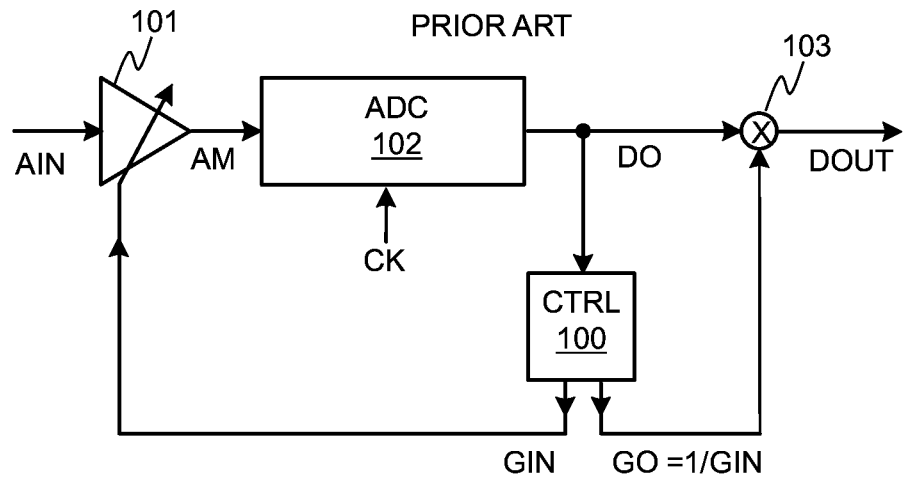
FIG. 1 illustrates the general principles of an analogue-to-digital convertor (ADC) implementing dynamic range extension (DRE)

FIG. 1 illustrates the general principles of an analogue-to-digital convertor (ADC) implementing dynamic range extension (DRE). A control block 100 adjusts the gain GIN applied to an analogue input signal AIN by an analogue gain element such as an analogue amplifier 101 so that, regardless of the peak value of the magnitude of the incoming signal AIN, the ADC 102 receives an amplified analogue signal AM (where AM=AIN.GIN) with peak values near the ADC full scale input range. The control block 100 also compensates for this analogue gain adjustment GIN by arranging for the output signal DO to be scaled by a digital gain GO, which is the inverse of the analogue gain GIN, via digital multiplier 103. The control block 100 adjusts the allocation of the gains between the analogue and digital gain elements 101 and 103 based on the amplitude or envelope of the input signal AIN.

Conventional dynamic range extension is effective for input audio signals with a flat frequency response. However, in instances where the frequency response of the input signal is not flat, such as for speech, gain is limited by the maximum signal level at any one frequency across the signal's spectrum.

The typical power spectrum for an audio signal derived from human speech is particularly non uniform. The human speech spectrum is inversely proportional to frequency, having a relatively high signal level at low frequencies, the signal level tailing off at high frequencies.

Figure 2:
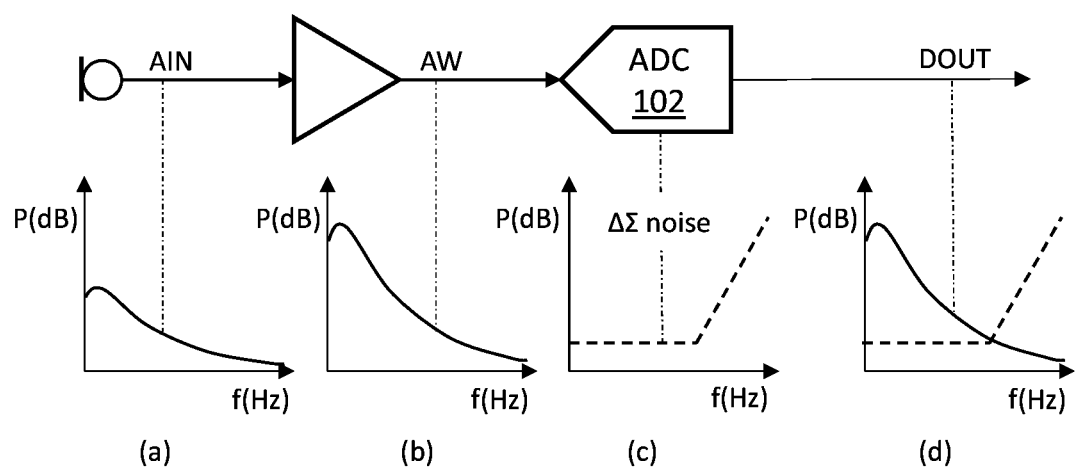
FIG. 2 graphically illustrates the effect of conversion of an audio signal comprising human speech derived from a microphone using the ADC shown in FIG. 1.

FIG. 2 graphically illustrates the effect of conversion of an audio signal comprising human speech derived from a microphone using the ADC 102. In this case the ADC 102 is a sigma delta ADC of the type typically used in audio applications. The input speech signal, shown in graph (a), is amplified by the amplifier 101 and the amplified signal shown in graph (b) provided to the ADC 102 which converts the received amplified signal to a digital representation. The sigma delta ADC 102 applies noise, shown in graph (c), which increases at high frequencies due to inherent noise shaping in the ADC 102. This noise is added by the ADC 102 to the digital representation of the input audio signal and the ADC 102 outputs a digital audio signal as shown in graph (d). It can thus be seen that as frequency increases the SNR of the digital output signal decreases to a point at which the level of the speech drops below the ADC 102's noise floor.

Embodiments of the present disclosure aim to address or at least ameliorate one or more or the above issues by implementing a non-uniform, adaptive filtering technique in which an input audio signal is filtered to substantially whiten or flatten its frequency response. This filtered or whitened audio signal is then provided to an ADC and subsequently apply an inverse whitening filter to the digital representation output from the ADC.

Figure 3:
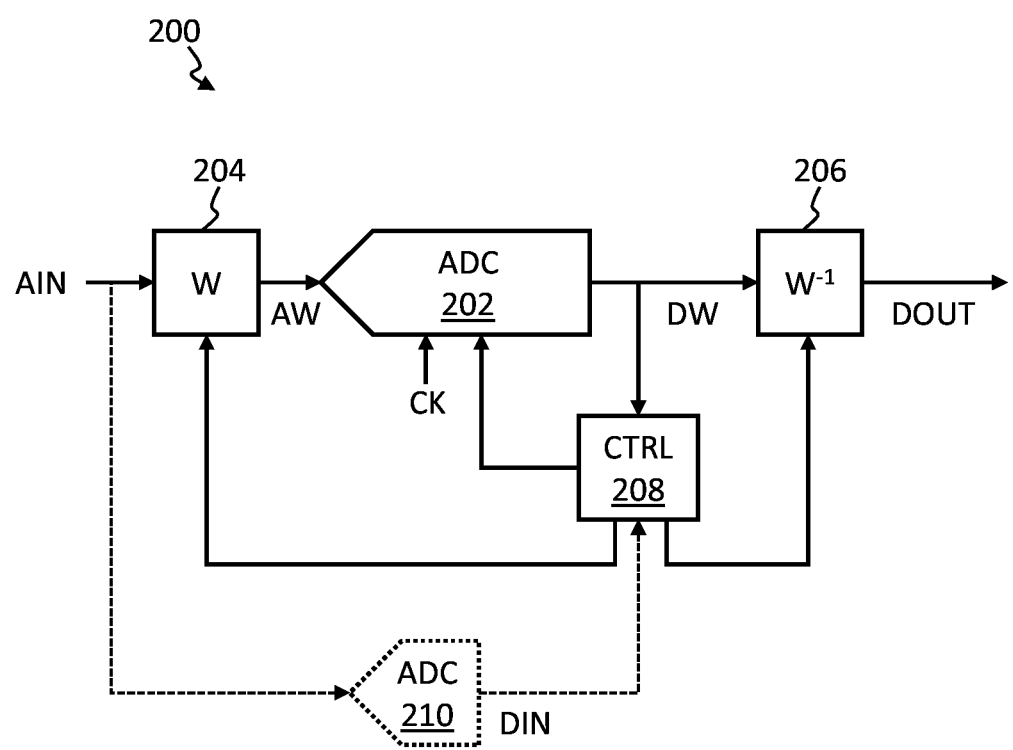
FIG. 3 is a block diagram of an ADC according to embodiments of the present disclosure.

FIG. 3 is a block diagram of an analogue-to-digital convertor (ADC) 200 according to embodiments of the present disclosure. The ADC 200 comprises a first ADC 202, a whitening filter 204, a de-whitening filter 206 and a control module 208. Optionally, the ADC 200 comprises a second ADC 210.

The whitening filter 204 is configured to receive an audio signal AIN and output a whitened audio signal AW to the first ADC 202. The whitening filter 204 may be configured to implement any filter configured to whiten or flatten the audio signal AIN. Non-limiting examples include a shelving filter, a low pass filter, a high pass filter, a bandpass filter, a pre-emphasis filter and a differentiator or any reasonable combination thereof. Further implementation examples of the whitening filter 204 will be explained in more detail below.

The first ADC 202 receives a clock signal CK, which may or may not be provided by the control module 208 and converts the whitened audio signal AW to a digital whitened audio signal DW. The first ADC 202 is preferably a sigma delta ADC of the type typically used in audio applications. The digital whitened audio signal DW is provided to a de-whitening filter 206 which equalises the digital whitened audio signal to remove the whitening introduced by the whitening filter 204. Thus, the de-whitening filter 206 may apply a digital filter which is an approximate inverse of the analogue filter applied to the audio signal AIN by the whitening filter 204. The de-whitening filter 206 then outputs this digital output signal DOUT.

In a variation, the de-whitening filter 206 may be omitted and the digital whitened signal DW output from the ADC 200. In such cases, the characteristics of the whitening filter 204 may also be output, for example by the control module 208 or from the whitening filter 204 itself. This variation may be applicable where the output digital whitened signal DW is being provided to a machine learning block (not shown). For example, the digital whitened signal DW and one or more control outputs from the control module 208 may be provided to one or more neural networks.

The whitening filter 204 and the de-whitening filter 206 are preferably adaptive. The adaptive nature of the whitening filter 204 may avoid or at last reduce clipping of the audio signal AIN by the first ADC 202. The control module 208 is thus configured to control at least the whitening filter 204 based on, directly or indirectly, the audio signal AIN received by the ADC 200. In the embodiment shown, the control module 208 adapts the whitening filter 204 based on the digital whitened signal DW output from the first ADC 202 (i.e. indirectly on the audio signal AIN). In alternative embodiments, the control module may, additionally or alternatively, adapt the whitening filter 204 based on the whitened audio signal AW output from the whitening filter 204, or directly based on the audio signal AIN. Equally, the digital output signal DOUT could be used as an input to the control module 208 upon which to base the adaptation of the whitening filter 204.

The de-whitening filter 206 may also be controlled by the control module 208, as is shown in FIG. 3. In which case, the de-whitening filter 206 may be adapted in a similar manner to that described in respect of the whitening filter 204. Alternatively, the de-whitening filter 206 may be adapted based on the characteristics of the whitening filter 204.

The control module 208 may also be configured to bypass the whitening filter 204, the de-whitening filter 206 or both. Such bypassing may be performed, for example, if it is determined that clipping may occur due to one or more events in the audio input signal AIN.

Optionally, the ADC 200 may comprise a second ADC 210 configured to convert the analogue audio input signal AIN to a digital audio input signal DIN which may then be provided to the control module 208. The second ADC 210 may have a lower resolution than the first ADC 202 and may be substantially faster than the first ADC 202 in converting an analogue input signal into a corresponding digital signal. In some embodiments, the second ADC 210 is a successive-approximation ADC or a low-resolution sigma-delta ADC. By providing the second ADC 210, any events in the audio input signal AIN that might lead to clipping in the first ADC 202 can be detected by the control module 208. In response to detecting such events, the control module 208 may adjust one or more characteristics of the whitening filter 204 and/or the de-whitening filter 206 to prevent or reduce clipping. In some embodiments control module 208 may bypass the whitening filter 204, the de-whitening filter 206 or both based on the digital input signal DIN received from the second ADC 210.

Optionally, the control module 208 may be configured to adapt the first ADC 202 based on one or more of the above described inputs to the control module 208. For instance, the control module 208 may adjust the performance of the first ADC 202 based on the audio signal AIN, the whitened signal AW, the digital whitened signal DW or the output signal DOUT. Performance of the first ADC 202 may be adapted by changing one or more characteristics of configurations of the first ADC 202. For example, the order of the first ADC 202 may be changed. For example, an over-sampling ratio of the first ADC 202 may be changed. For example, a bias current of one or more circuits of the ADC 202 may be changed. For example, a number of bits in a quantizer of the first ADC 202 (where the first ADC 202 is a sigma delta ADC) may be changed. In a further example, one or more analogue amplifier-based integrators used in the first ADC 202 may be switched out or substituted for a corresponding inverter-based amplifier, such as a switch capacitor integrator circuit comprising an inverter. Such inverter-based amplifiers are well known and will not be described in detail here. An example of such architecture is described in "*A Two Stage Switched-Capacitor Integrator for High Gain Inverter-Like Architectures*", P Bruschi et al, IEEE Transactions on Circuits and Systems, Vol. 67, No. 2, the contents of which is incorporated by reference in its entirety.

Figure 4:
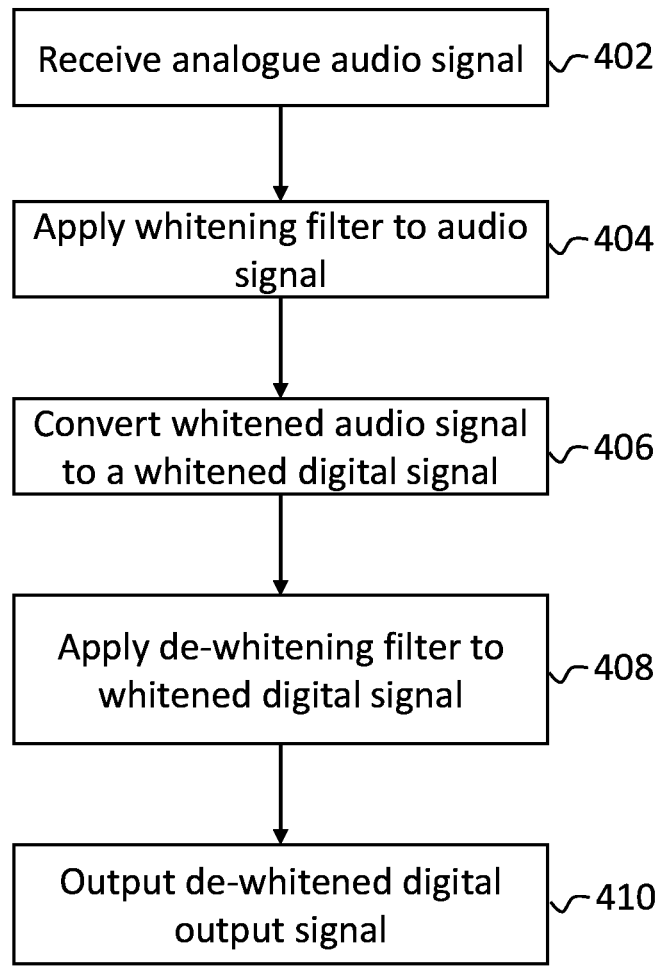
FIG. 4 is a block diagram of a process performed by the ADC shown in FIG. 3.
Figure 5:
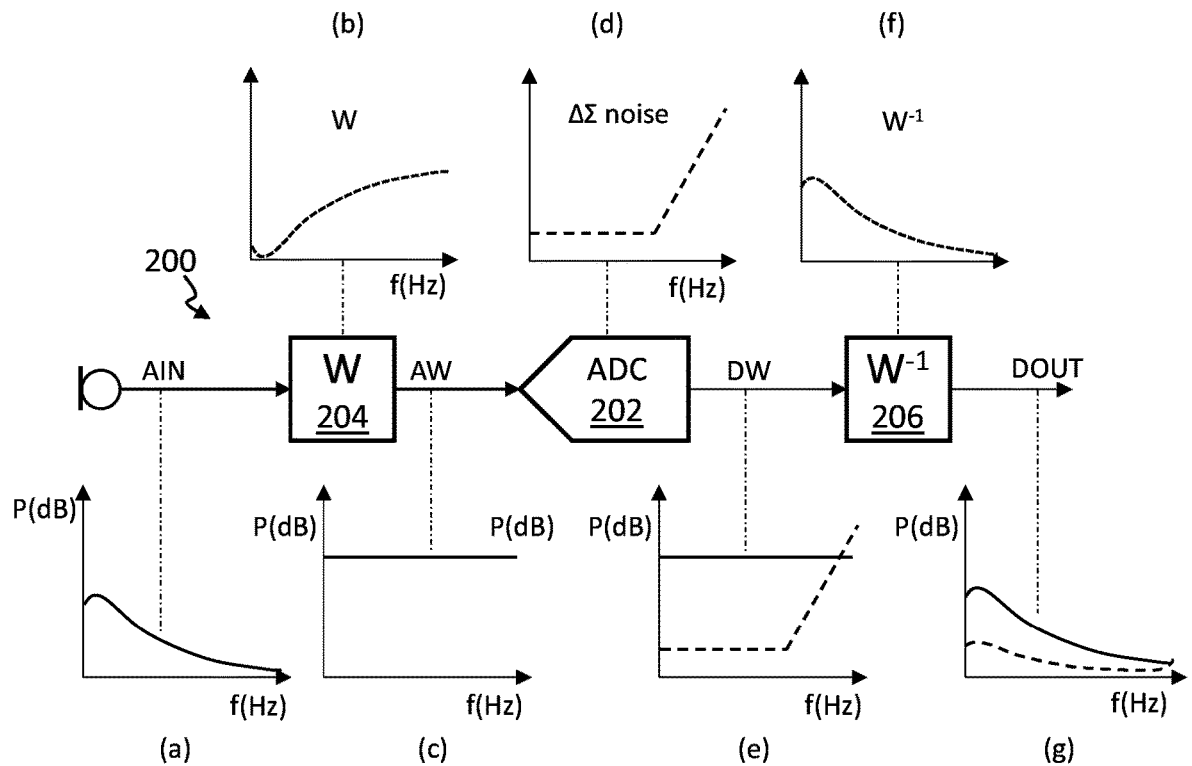
FIG. 5 graphically illustrates the effect of conversion of an audio signal comprising human speech derived from a microphone using the ADC shown in FIG. 3.

FIG. 4 illustrates steps for conversion of an audio signal AIN comprising human speech derived from a microphone by the ADC 200 and FIG. 5 illustrates the effect of the conversion in accordance with embodiments of the present disclosure. For simplicity, the control module 208 and the second ADC 210 have been omitted from FIG. 5.

Referring to both FIG. 4 and FIG. 5, at step 402, an audio signal AIN is received by the ADC 200.

The audio signal AIN, which comprises human speech and is shown in graph (a), is whitened at step 404 by the whitening filter 204 which applies an equalisation shown in graph (b) to substantially whiten or flatten the input speech signal AIN. The characteristics of the whitening filter 204 may be controlled by the control module 208.

At step 406, the whitened audio signal AW, shown in graph (c), is provided to the ADC 202 which converts the whitened input signal AW to a digital representation. Noise inherent to the sigma delta ADC 202, shown in graph (d) is added during the conversion. Again, this noise increases at high frequencies due to inherent noise shaping in the ADC 202. This noise is added by the ADC 202 to the digital representation of the input audio signal and the ADC 202 outputs a whitened digital signal DW as shown in graph (e).

Because the signal input to the ADC 202 is substantially whitened, it can be seen from graph (e) that SNR of the digital representation output from the ADC 202 is maintained across a larger frequency range. It can also be seen that the noise crossover occurs at a much higher frequency when compared to the prior art arrangement shown in FIG. 2.

To restore the information from the original input speech signal shown in (a), at step 408, a de-whitening filter 206 digitally filters the whitened digital signal DW with a filter which is substantially inverse to that which was applied by the whitening filter 204, as shown by graph (f). The result shown in graph (g) is a digital output signal DOUT which is a digital representation of the input speech signal AIN. The dashed line represents the filtered noise whose level is below the level of the speech signal substantially across the frequency range of speech.

The digital output signal DOUT is then output at step 410.

Referring again to FIG. 3 and as mentioned above, the whitening filter 204 may implement any conceivable filter configured to whiten the audio signal AIN.

Figure 6:
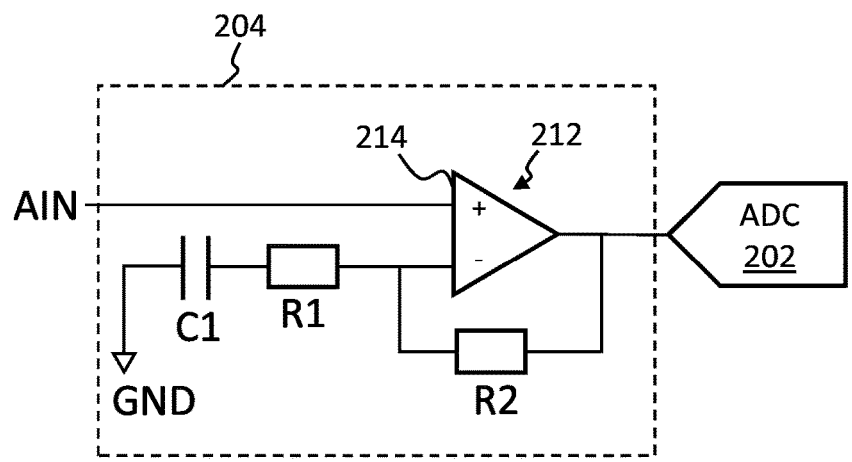
FIG. 6 is a circuit diagram of a whitening filter of the ADC shown in FIG. 3.

FIG. 6 illustrates an example configuration for the whitening filter 204 as a shelving filter. In the example shown in FIG. 6, the whitening filter 204 comprises a non-inverting amplifier 212 comprising an operational amplifier (op-amp) 214, a capacitor C1, a first resistor R1 and a second resistor R2. It will however be appreciated that a corresponding inverting topology may be equally used to achieve a similar effect as that of the non-inverting topology shown in FIG. 6.

The input audio signal AIN is provided to the non-inverting input of the op-amp 214. The inverting input of the op-amp 214 is coupled to ground GND via the first resistor R1 followed by the capacitor C1. The inverting input of the op-amp 214 is coupled to the output of the op-amp 214 via the second resistor R2. The output of the op-amp 214 is then provided to the first ADC 202.

Figure 7:
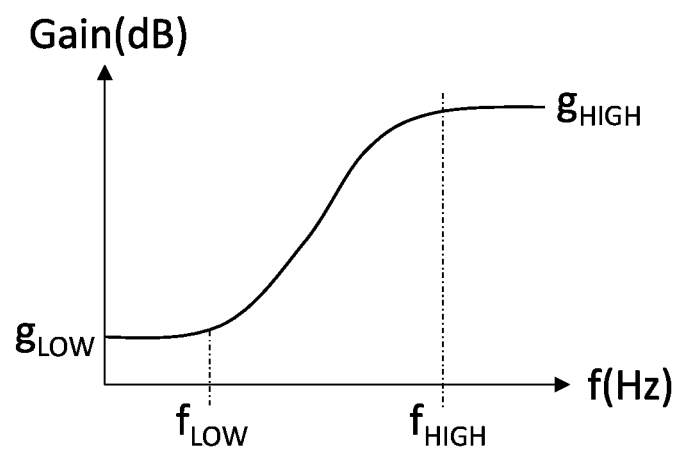
FIG. 7 is a graph showing a frequency response of the whitening filter of FIG. 6 according to embodiments of the present disclosure.

The frequency response of the whitening filter 204, in this instance a shelving filter, is shown in FIG. 7, where:

$$g_{LOW} = 1$$
$$g_{HIGH} = \frac{R2}{R1} = \frac{f_{LOW}}{f_{HIGH}}$$
$$f_{LOW} = \frac{1}{2\pi C1(R1+R2)}$$
$$f_{HIGH} = \frac{1}{2\pi C1 R1}$$

Thus, by adjusting the values of the first resistor R1, the second resistor R2 and the capacitor C1, the frequency response of the whitening filter 204 can be adapted. As such, one or more of the first and second resistors R1, R2 and the capacitor C1 may be variable, the values controlled by the control module 208.

In some embodiments, the frequency $f_{LOW}$ may be fixed. The maximum gain $g_{HIGH}$ that can be applied without clipping of the input audio signal AIN may then be determined by the control module. In doing so, the value $f_{HIGH}$ can be calculated:

$$f_{HIGH} = \frac{f_{LOW}}{g_{HIGH}}$$

In some embodiments, the value R1 may be fixed for input noise requirements. C1 and R2 may then be adjusted by the control module 208. From the above equations for $f_{HIGH}$, C1 and R1 are given by:

$$C1 = \frac{1}{2\pi * f_{HIGH} * R1}$$
$$R2 = \frac{1 - 2\pi C1 * f_{LOW} * R1}{2\pi C1 * f_{LOW}}$$

As mentioned above, the control module 208 may determine a transfer function for the de-whitening filter 206. In some embodiments, this transfer function $W^{-1}$ may be approximated by discretising and subsequently inverting the analogue transfer function W of the whitening filter 204. The analogue filter or transfer function W may be discretised using a bilinear transform to transform the s-plane to the z-plane as set out by the following equation:

$$s \rightarrow 2f_s \frac{1-z^{-1}}{1+z^{-1}}$$

Where $f_s$ is the sampling frequency at the point at which the de-whitening filter 206 is applied.

It will be appreciated that due to the discretisation of the digitally implemented de-whitening filter 206, there may be a mismatch between the whitening filter 204 and the de-whitening filter 206. Preferably, to minimise the impact of this over the audio frequency band and maximise the SNR for ultrasonic components of the audio signal, the values of R1, R2 and 01 may be set such that $f_{LOW}$ falls outside of the audio frequency band. For example, $f_{LOW}$ may be set at 6 kHz or above, or 7 kHz or above, or 8 kHz. In doing so, only the power spectrum above $f_{LOW}$ will be whitened by the whitening filter 204.

Figure 9:
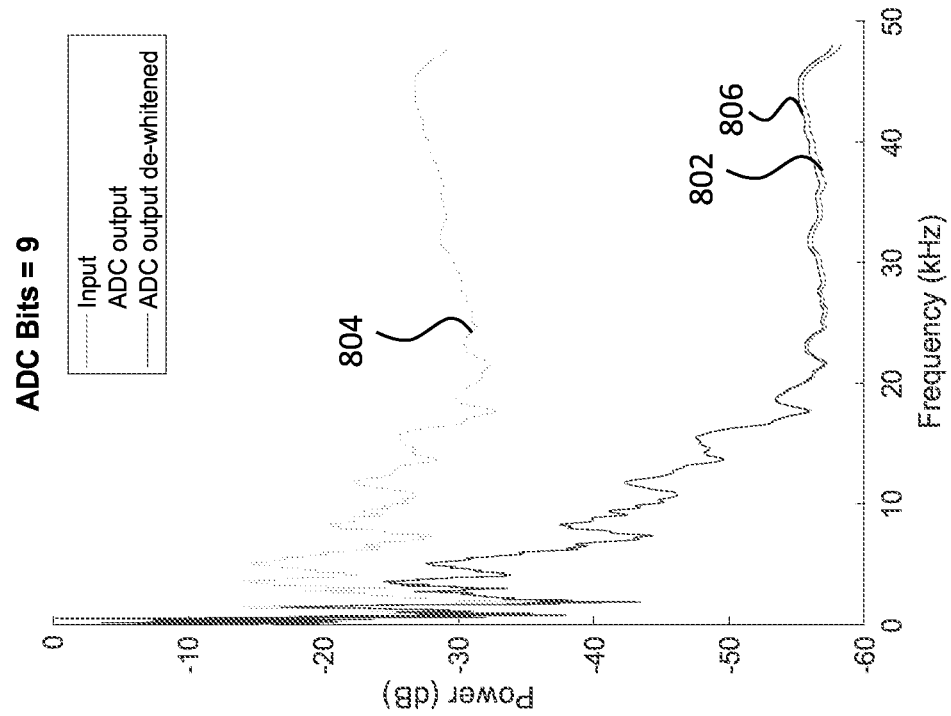
FIG. 9 is a graph showing frequency response of an audio signal input into the ADC of FIG. 3 and a digital output signal output from the ADC of FIG. 3 with and without whitening and de-whitening implemented.
Figure 8:
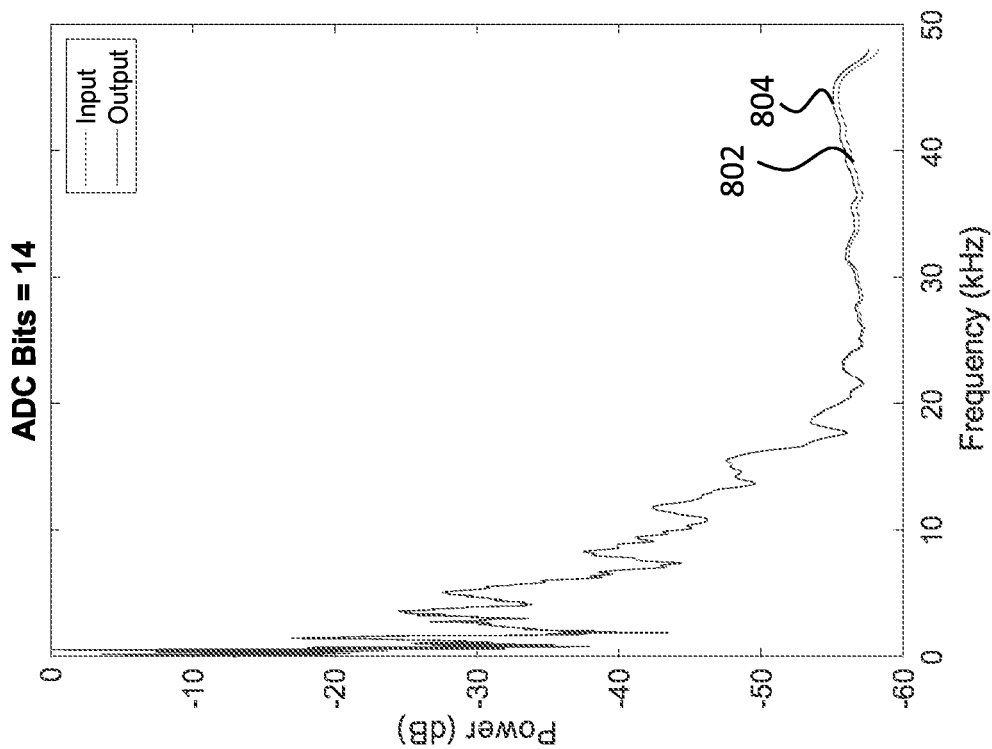
FIG. 8 is a graph showing frequency response of an audio signal input into the ADC of FIG. 3 and a digital output signal output from the ADC of FIG. 3.

FIGS. 8 and 9 graphically illustrate the effect of the whitening filter 204 in whitening the audio input signal AIN with the shelving filter depicted in FIG. 7.

FIG. 8 graphically illustrates the audio input signal AIN (line 802) and the digital output signal DOUT (line 804) with the whitening filter 204 and de-whitening filter 206 bypassed (line 806) such that no whitening is performed. In this example, the first ADC 202 is a 14-bit sigma-delta ADC and at least 14 bits are required for the digital output signal DOUT to substantially match the audio input signal AIN.

FIG. 9 graphically illustrates the audio input signal AIN (line 902) and the digital output signal DOUT with the whitening filter 204 and de-whitening filter 206 bypassed (line 904) and with the whitening filter 204 and de-whitening filter 206 implemented (line 906) using the shelving filter shown in FIG. 7. In this example, the first ADC 202 is a 9-bit sigma delta ADC. It can be seen that with a 9-bit solution, the non-whitened digital output signal depicted by line 904 is substantially mismatched relative to the input signal denoted by line 902. In contrast, at the same 9-bit resolution, the digital output signal which is the product of whitening and de-whitening (line 906) substantially matches the audio input signal AIN (line 902).

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. An analogue-to-digital converter (ADC), comprising:
   an adaptive whitening filter configured to filter an analogue input signal and output a whitened analogue input signal;
   a first converter configured to receive said whitened analogue input signal and output a whitened digital signal;
   an adaptive de-whitening filter configured to filter the whitened digital signal and output a de-whitened digital output signal, the de-whitening filter being substantially inverse to the whitening filter; and
   a controller configured to adapt the whitening filter and the de-whitening filter based on the analogue input signal.

2. The ADC of claim 1, wherein the whitening filter is one of:
   a) a shelving filter;
   b) a bandpass filter;
   c) a high pass filter; and
   d) a differentiator.

3. The ADC of claim 1, wherein the controller is configured to adapt the whitening filter based on the whitened digital signal.

4. The ADC of claim 1, wherein the controller is further configured to adapt the first converter based on the analogue input signal.

5. The ADC of claim 4, wherein the controller is configured to adapt the first converter based on the whitened digital signal.

6. The ADC of claim 4, wherein the first converter is a sigma-delta ADC and wherein adapting of the first converter comprises one or more of:
   a) changing an order of the ADC;
   b) changing an over sample ratio of the ADC;
   c) changing a bias current of one or more circuits in the ADC;
   d) changing a number of bits in a quantizer of the ADC; and e) switching between a high-performance integrator and a low-performance integrator.

7. The ADC of claim 1, wherein adapting the whitening filter comprises selectively bypassing the whitening filter.

8. The ADC of claim 7, further comprising a second converter configured to receive said analogue input signal and output a secondary digital signal to the controller, wherein the controller is configured to selectively bypass the whitening filter based on the secondary digital signal.

9. The ADC of claim 7, wherein the controller is configured to selectively bypass the whitening filter in response to detecting that the analogue input signal exceeds a clipping threshold.

10. An electronic device comprising an ADC as claimed in claim 1.

11. A method of analogue-to-digital conversion, comprising:
   whitening an analogue input signal with a whitening filter to generate a whitened analogue input signal;
   converting the whitened analogue input signal with a first converter to generate a whitened digital signal; and
   filtering the whitened digital signal and outputting a de-whitened digital output signal, with an adaptive de-whitening filter, the de-whitening filter being substantially inverse to the whitening filter; and
   adapting the whitening filter and the de-whitening filter based on the analogue input signal.

12. The method of claim 11, wherein the whitening filter is one of:
   a) a shelving filter;
   b) a bandpass filter;
   c) a high pass filter; and
   d) a differentiator.

13. The method of claim 11, wherein the de-whitening filter is adapted based on the whitened digital signal.

14. The method of claim 11, further comprising adapting the first converter based on the received analogue input signal.

15. The method of claim 14, wherein the first converter is adapted based on the whitened digital signal.

16. The method of claim 14, wherein the first converter is a sigma-delta ADC and wherein adapting of the first converter comprises one or more of:
   a) changing an order of the ADC;
   b) changing an over sample ratio of the ADC;
   c) changing a bias current of one or more circuits in the ADC;
   d) changing a number of bits in a quantizer of the ADC.

17. The method of claim 11, wherein adapting the whitening filter comprises selectively bypassing the whitening filter, the method further comprising converting with a second converter the analogue input signal to generate a secondary digital signal, wherein the whitening filter is selectively bypassed based on the secondary digital signal.

18. The method of claim 17, wherein the whitening filter is selectively bypassed in response to detecting that the analogue input signal exceeds a clipping threshold.

19. The ADC of claim 1, wherein the controller is configured to adapt the whitening filter based on the de-whitened digital output signal.

20. The ADC of claim 1, wherein the controller is configured to adapt the first converter based on the analogue input signal and the de-whitened digital output signal.

21. The method of claim 11, the de-whitening filter is adapted based on the de-whitened digital output signal.

22. The method of 11, further comprising adapting the first converter based on the analogue input signal and the de-whitened digital output signal.

* * * * *

UNITED STATES PATENT AND TRADEMARK OFFICE
CERTIFICATE OF CORRECTION

PATENT NO. : 11,600,280 B2
APPLICATION NO. : 17/036382
DATED : March 7, 2023
INVENTOR(S) : John P. Lesso It is certified that error appears in the above-identified patent and that said Letters Patent is hereby corrected as shown below:

In the Claims

1. In Column 11, Line 21, in Claim 11, delete "signal; and" and insert -- signal; --, therefor.

2. In Column 12, Line 2, in Claim 14, delete "received analogue" and insert -- analogue --, therefor.

3. In Column 12, Lines 25-26, in Claim 19, delete "whitening filter based on the de-whitened digital output signal." and insert the same on Line 24, after "adapt the" as continuation point.

4. In Column 12, Line 32, in Claim 22, delete "11," and insert -- claim 11, --, therefor.

Signed and Sealed this
First Day of August, 2023

Katherine Kelly Vidal
*Director of the United States Patent and Trademark Office*